United States Patent [19]

Hayase

[11] Patent Number: 5,097,197
[45] Date of Patent: Mar. 17, 1992

[54] SIGNAL LEVEL ATTENUATING DEVICE

[75] Inventor: Toru Hayase, Higashihiroshima, Japan

[73] Assignee: Sharp Kabushiki Kaisha, Osaka, Japan

[21] Appl. No.: 713,266

[22] Filed: Jun. 11, 1991

[30] Foreign Application Priority Data

Aug. 10, 1990 [JP] Japan ................................ 2-212616

[51] Int. Cl.$^5$ .............................................. G05F 1/63
[52] U.S. Cl. ..................... 323/353; 323/298; 323/367; 333/81 R
[58] Field of Search ............... 323/293, 297, 298, 352, 323/353, 354, 364, 367; 333/81 R

[56] References Cited

U.S. PATENT DOCUMENTS

| | | | |
|---|---|---|---|
| 3,525,926 | 8/1970 | Maczka | 323/353 |
| 3,601,718 | 8/1971 | Arnesen | 323/353 |
| 3,765,020 | 10/1973 | Seager et al. | 333/81 R |
| 4,415,897 | 11/1983 | Kennedy | 342/205 |
| 4,644,193 | 2/1987 | Ott | 333/81 R |
| 4,683,386 | 7/1987 | Kamikawara | 333/81 R |
| 4,810,949 | 3/1989 | Schiemenz et al. | 333/81 R |

*Primary Examiner*—Peter S. Wong

[57] ABSTRACT

A signal level attenuating device having an analog attenuator and a digital attenuator which respectively include resistance attenuators. The resistance attenuators have the same attenuating characteristics and are mutually coupled. When one of the resistance attenuators is adjusted, the other of the resistance attenuators is simultaneously adjusted so that an analog signal and a digital signal respectively entered therein are attenuated at an identical attenuating factor. The digital attenuator further comprises an A/D convertor, a coefficient generator and a multiplier. The resistance attenuator in the digital attenuator attenuates a reference voltage and sends it to the A/D convertor. The coefficient generator computes an attenuation coefficient by which the digital signal entered therein is to be multiplied, based on an output of the A/D convertor. The digital signal is multiplied by the attenuation coefficient in the multiplier. The result of the multiplication is released as a digital output to an external device. The attenuation coefficient corresponds to the attenuating factor of the resistance attenuator of the analog attenuator. The digital signal and the analog signal are attenuated at an identical attenuating factor.

9 Claims, 2 Drawing Sheets

SIGNAL LEVEL ATTENUATING DEVICE

FIELD OF THE INVENTION

The present invention relates to a signal level attenuating device which carries out attenuation adjustment of a level of a signal belonging to an analog system as well as attenuation adjustment of a level of a signal belonging to a digital system a system such as an audio device in which an acoustic signal belonging to the analog system and an acoustic signal belonging to the digital system are intermixed.

BACKGROUND OF THE INVENTION

Conventionally, a level of a signal is attenuated and adjusted by methods described hereinbelow in a system in which an audio signal and a digital signal are intermixed.

(1) A method whereby the analog signal and the digital signal are adjusted and attenuated by separate attenuating means.

(2) A method whereby a level of the digital signal is attenuated and adjusted by setting an attenuation coefficient of the digital signal through fixing step width discretely (for example, by making an output change by 0.5 dB every time 1 pulse is counted in an analog electronic attenuator) in order to make an attenuated value of the digital signal correspond to an attenuated value of the analog signal.

(3) A method whereby a level of the digital signal is attenuated and adjusted by means for detecting an operation rotation angle or slide width of an analog attenuator, the attenuation coefficient of the digital signal being set based on a value detected by the above means.

However, the attenuation methods (1) to (3) described above present the following problems.

In the method (1), signals belonging to two systems, i.e., the analog system and the digital system, must be adjusted separately. Since an attenuation adjustment circuit becomes necessary for each of the systems, it becomes complicated to adjust the attenuation adjustment circuits resulting in deterioration in operability. Another problem is an overall rise in cost.

In the method (2), fine adjustment cannot be carried even with respect to the analog signal out within a step width smaller than the fixed step width. A special circuit element such as the analog electronic attenuator further becomes necessary.

In the method (3), relatively bulky detection means such as a rotary encoder becomes necessary for detecting the operation rotation angle or the slide width of the analog attenuator. A further problem is that it is difficult to make the attenuating factor of the signal of the analog system (referred to hereinafter as analog system signal) exactly identical to the attenuating factor of the signal of the digital system (referred to hereinafter as digital system signal).

SUMMARY OF THE INVENTION

An object of the present invention is to provide a signal level attenuating device having a simple configuration, thereby making an attenuating factor of a level of an analog system signal always exactly identical to an attenuating factor of a level of a digital system signal.

In order to attain the above object, a signal level attenuating device of the present invention comprises: first attenuating means for attenuating an analog signal entered therein; and second attenuating means for attenuating a digital signal entered therein, the first and second attenuating means having the same attenuating characteristics as well as being mutually coupled so that adjustment can be carried out simultaneously, and an attenuating factor of the first attenuating means always becomes identical to an attenuating factor of the second attenuating means.

With the above arrangement, when the attenuating factor of the first attenuating means is adjusted, an analog signal entered therein is attenuated at the adjusted attenuating factor and is then released as an analog signal.

On the other hand, the second attenuating means has the same attenuating characteristics as the first attenuating means and is coupled to the first attenuating means. The attenuating factor of the second attenuating means therefore gets adjusted to be identical to the attenuating factor of the first attenuating means. As a result, a digital signal entered into the second attenuating means is attenuated at the attenuating factor which is identical to the attenuating factor of the analog signal and is then released as a digital signal.

In the configuration described above, the digital signal may equally be entered into the second attenuating means via A/D convertor means.

In this case, when a single analog signal is entered into the first attenuating means and the A/D convertor means, the digital signal released from the second attenuating means can be directly transmitted to an external device. In a case where an analog signal is transmitted to the external device, deterioration of signal quality takes place due to reasons such as lowering of signal level resulting from power loss during transmission, or due to other reasons. However, in the case where a digital signal is directly transmitted to the external device, signal quality can be improved reliably because deterioration of signal quality is reduced compared to the case where the analog signal is transmitted to the external device. Moreover, in this case, contamination of analog system noise can be avoided. The longer a transmission path, the more remarkable is the effectiveness.

Furthermore, another analog output can be released to the external device by converting an output of the second attenuating means into an analog signal using D/A convertor means, whereby the analog output is an analog signal which has been attenuated at the attenuating factor which is identical to the attenuating factor of the first attenuating means.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a block diagram showing a configuration of essential parts of a first embodiment of a signal level attenuating device related to the present invention.

FIG. 2 is a block diagram showing a configuration of essential parts of a second embodiment of a signal level attenuating device related to the present invention.

DESCRIPTION OF THE EMBODIMENTS

Figure 1:
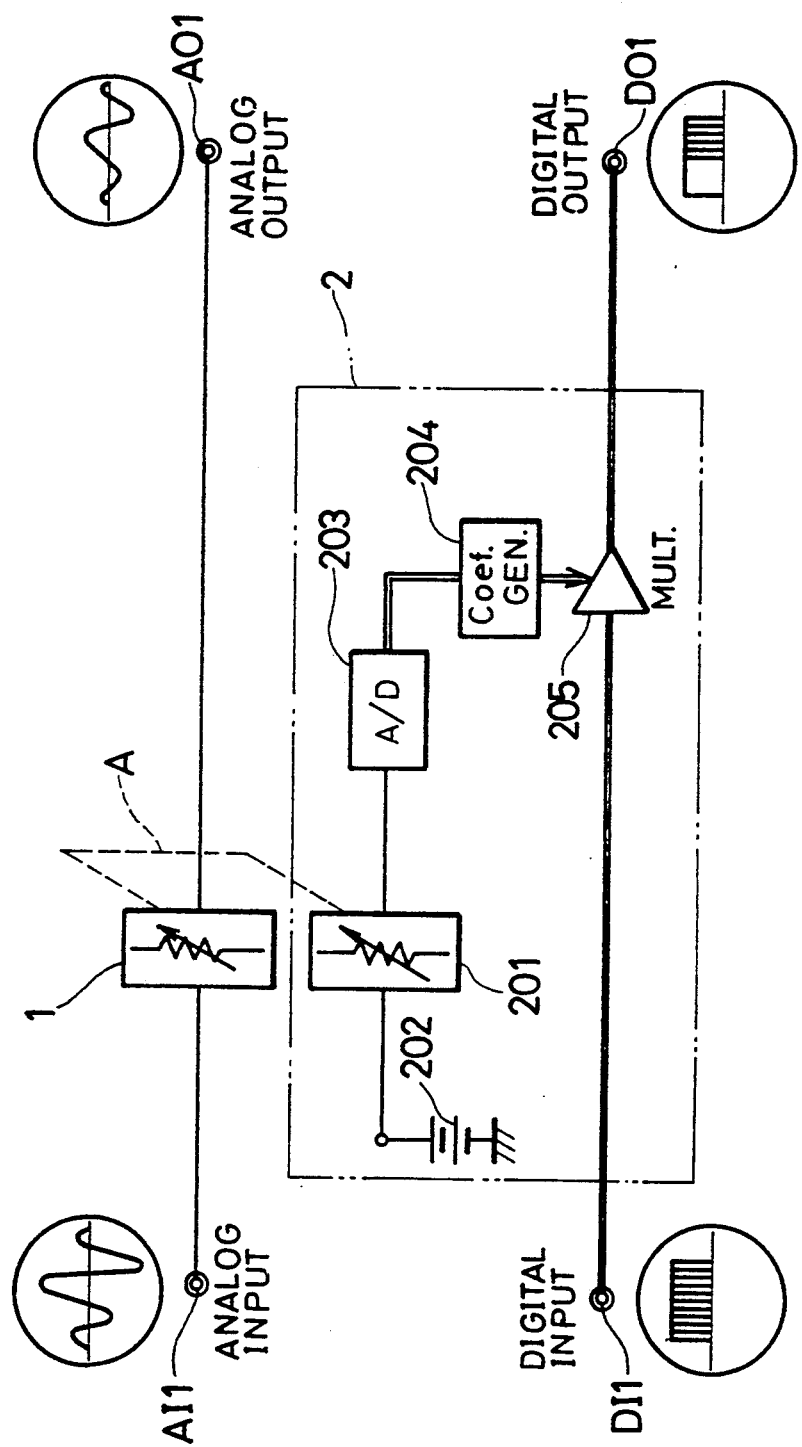
FIGS. 1 and 2 show detailed views of the present invention.

A first embodiment of the present invention is described hereinbelow referring to FIG. 1.

A signal level attenuating device of the present invention comprises an analog attenuating system and a digital attenuating system. As shown in FIG. 1, the analog attenuating system includes an analog attenuator 1 (first attenuating means, first resistance attenuator) and the digital attenuating system comprises a digital attenuator 2 (second attenuating means).

The digital attenuator 2 comprises a DC source 202 (reference voltage generating means), an analog attenuator 201 (second resistance attenuator), an A/D convertor 203, a coefficient generator 204 (attenuation coefficient generating means) and a multiplier 205 (multiplying means).

The analog attenuator 1 of the analog attenuating system is coupled to the analog attenuator 201 in the digital attenuating system, as shown by broken line A in FIG. 1, and the analog attenuator 1 includes a resistance attenuator which has the same attenuating characteristics as attenuating characteristics of a resistance attenuator included in the analog attenuator 201.

That is, when an attenuating factor of the analog attenuator 1 is adjusted, an attenuating factor of the analog attenuator 201 which is coupled to the analog attenuator 1 also gets adjusted. As a result, both the attenuators are adjusted to an identical attenuating factor. On the other hand, when the attenuating factor of the analog attenuator 201 is adjusted, the attenuating factor of the analog attenuator 1 which is coupled to the analog attenuator 201 also gets adjusted. Both the attenuators are also adjusted to an identical attenuating factor.

An input terminal of the analog attenuator 201 is connected to a positive pole that is an output terminal of the DC source 202. A reference voltage (fixed voltage) is applied to the input terminal of the analog attenuator 201 from the output terminal of the DC source 202. A negative pole of the DC source 202 is grounded.

An output of the analog attenuator 201 is sent to the multiplier 205 via the A/D convertor 203 and the coefficient generator 204 (the attenuation coefficient generating means). An attenuation coefficient is computed by the coefficient generator 204 and is sent to the multiplier 205. The attenuation coefficient determines the attenuating factor of digital data which is entered from a digital input terminal DI1 and is released from a digital output terminal DO1.

The multiplier 205 multiplies the digital data entered therein through the digital input terminal DI1 by the attenuation coefficient which is computed by the coefficient generator 204. The digital data is therefore attenuated at the attenuation coefficient responsive to a result of the multiplication and attenuated digital data is generated and released from the multiplier 205.

A detailed explanation follows hereinbelow of an operation performed according to the above configuration in a case, chosen for convenience's sake, wherein the attenuating factor of the analog attenuator 1 and the analog attenuator 201 is $\frac{1}{2}$.

Since the attenuating factor of the analog attenuator is set to $\frac{1}{2}$, when a signal of an analog system is entered into the analog attenuator 1 via an analog input terminal AI1, an amplitude of the signal of the analog system is attenuated to $\frac{1}{2}$ and is released from an analog output terminal AO1.

If a digital value (which corresponds to a case where the attenuating factor of the analog attenuator is 1) released from the A/D convertor 203 were designated as 1000 (value converted to decimal notation) when the reference voltage (the fixed voltage) is directly supplied by the DC source 202 to the A/D convertor 203 without the reference voltage passing through the analog attenuator 201 (as is normally the case), then a digital value released from the A/D convertor 203 can be designated as 500 (value converted to decimal notation). This is because the attenuating factor of the analog attenuator 201 has been set to $\frac{1}{2}$. An attenuation coefficient C is computed in the coefficient generator 204 as:

$$C = 500/1000 = 0.5$$

According to this computation result, a value of the attenuation coefficient C (in this case, 0.5) is written into a coefficient register in the multiplier 205.

Accordingly, signal data of the digital system which is released from the digital output terminal DO1 becomes $\frac{1}{2}$ of a magnitude of the digital data entered via the digital input terminal DI1 into the multiplier 205.

As described above, the attenuating factor of the signal of the digital system becomes identical to the attenuating factor of the signal of the analog system. This is the most important characteristic of the present invention. Of course, the attenuating factor of the analog attenuator 1 and the analog attenuator 201 are not limited to $\frac{1}{2}$, i.e., the attenuating factor may be set to any value. In other words, the attenuating factor of the signal of the analog system is always identical to the attenuating factor of the signal of the digital system for any attenuating factor.

As described above, a signal level attenuating device of the first embodiment comprises an analog signal level attenuating section having a first analog signal attenuating means for attenuating an analog signal level at any attenuating factor; and a digital signal level attenuating section having a DC source for releasing a reference voltage, a second analog signal attenuating means for attenuating the reference voltage at any attenuating factor, convertor means for converting an output of the second analog signal attenuating means to a digital value, attenuation coefficient generating means for computing an attenuation coefficient of a digital signal which is entered therein based on the digital value, and multiplying means for inputting the digital signal and for attenuating a level of the digital signal at the attenuation coefficient, wherein the first analog signal attenuating means and the second analog signal attenuating means have the same attenuating characteristics and are mutually coupled so that adjustment takes place simultaneously and the analog signal level attenuating factor of the analog signal level attenuating section is identical to the digital signal level attenuating factor of the digital signal level attenuating section.

Accordingly, the analog signal level attenuating factor of the analog signal level attenuating section and the digital signal level attenuating factor of the digital signal level attenuating section can both be adjusted and attenuated simultaneously by a single operation. Further, both the attenuating factors can be made to always be identical using a simple circuit configuration.

A second embodiment is described hereinbelow referring to FIG. 2. The second embodiment is an example of a signal processing circuit using the signal level attenuating device of the first embodiment.

Figure 2:
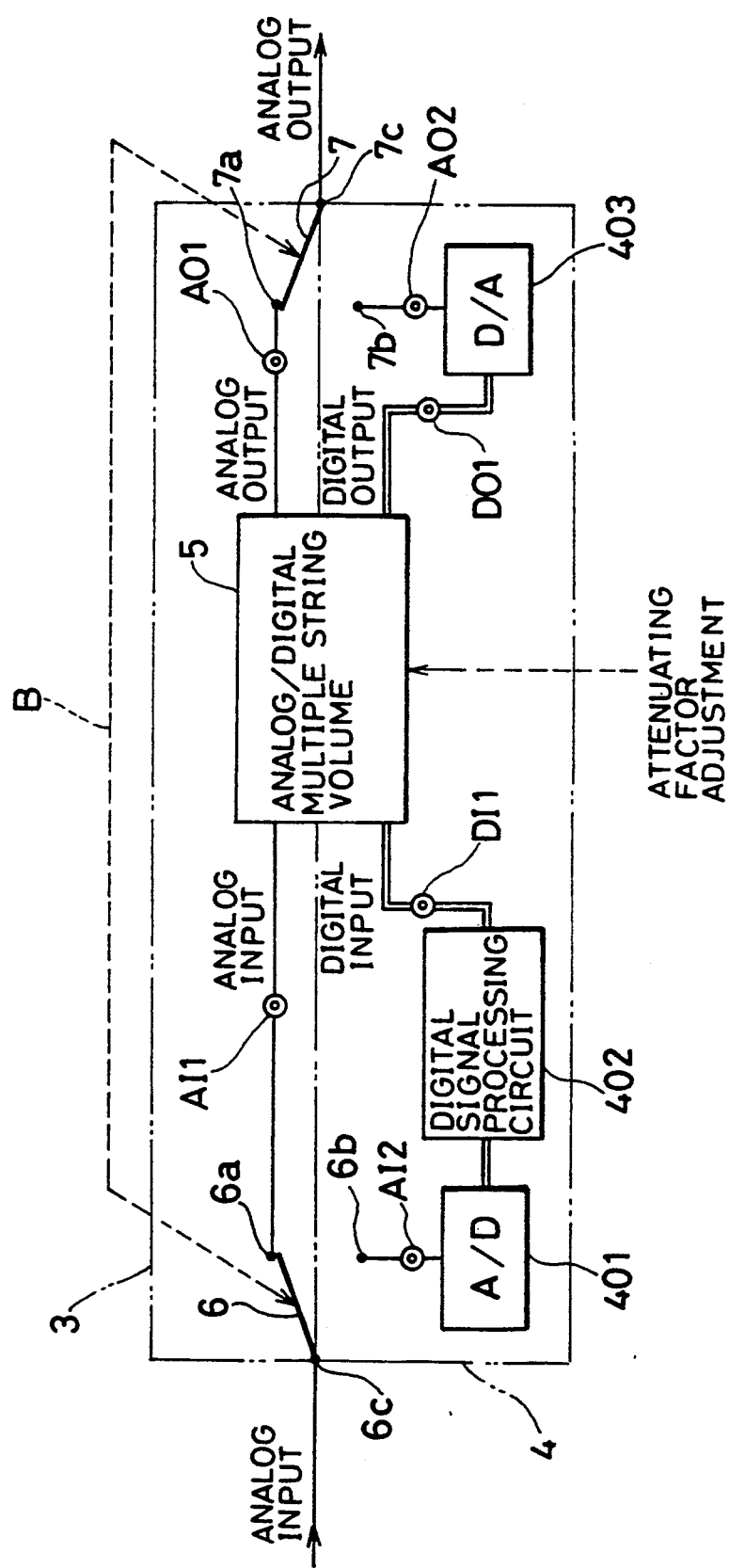

As shown in FIG. 2, the signal processing circuit comprises an analog system signal processing section 3 and a digital system signal processing section 4.

The analog system signal processing section 3 comprises an analog input terminal AI1, an analog attenuator 1 (see FIG. 1) in an analog/digital multiple string attenuator 5, and an analog output terminal AO1.

An analog system signal is entered into a common terminal 6c of a switch 6. A contact 6a of the switch 6 is connected to the analog input terminal AI1. In a case where the switch 6 is changed over to the contact 6a, the analog system signal is entered into the analog attenuator 1 via the common terminal 6c.

The analog system signal is then sent to a contact 7a of a switch 7 from the analog attenuator 1 after being attenuated at an adjusted attenuating factor. In a case where the switch 7 is changed over to the contact 7a, an output of the analog attenuator 1 is released as an analog output from the analog output terminal AO1 via the contact 7a and the common terminal 7c.

On the other hand, the digital system signal processing section 4 comprises an analog input terminal AI2, an A/D convertor 401 (A/D converting means), digital signal processing circuit 402 (signal processing means), a digital attenuator 2 in the analog/digital multiple string attenuator 5 (shown in FIG. 1), a D/A convertor 403 (D/A converting means) and an analog output terminal AO2.

A contact 6b of the switch 6 is connected to the analog input terminal AI2. In a case where the switch 6 is changed over from the contact 6a to the contact 6b, the analog system signal entered into the switch 6 is entered into the A/D convertor 401 via the analog input terminal AI2. In the A/D convertor 401, the analog system signal is converted into a digital signal and the digital signal is sent to the digital signal processing circuit 402.

The digital signal processing circuit 402 comprises a delay circuit (not shown) which carries out a predetermined delay processing with respect to the digital signal entered therein. The digital signal which has been delay processed is entered into a multiplier 205 (see FIG. 1) via a digital input terminal DI1 and is attenuated at an attenuating factor which is identical with the attenuating factor of the analog attenuator 1 (for details see the first embodiment). The attenuated digital signal is then sent to the D/A convertor 403 via a digital output terminal DO1. The digital signal is converted into an analog signal in the D/A convertor 403 and the analog signal is sent to an analog output terminal AO2.

The analog output terminal AO2 is connected to a contact 7b of the switch 7. When the switch 7 is changed over from the contact 7a to the contact 7b, an output is released from the D/A convertor 403 as an analog output from the analog output terminal AO2 via the contact 7b and the common terminal 7c.

Moreover, the switch 6 and the switch 7 are mutually coupled so as to change over simultaneously. That is, when the switch 6 is changed over to the contact 6a, the switch 7 is coupled to be changed over to the contact 7a, and when the switch 6 is changed over to the contact 6b, the switch 7 is coupled to be changed over to the contact 7b.

An input channel and an output channel of an analog system signal with respect to the analog system signal processing section 3 and the digital system signal processing section 4 become simplified since either the analog system signal processing section 3 or the digital system signal processing section 4 is selected according to the mutually coupled changeover of the switches 6 and 7, as shown by broken line B.

Instead of using the switches 6 and 7 which are mutually coupled to change over, the analog system signal may be applied in parallel to the analog input terminal AI1 and the analog input terminal AI2. An analog output may be released separately from the analog output terminal AO1 and the analog output terminal AO2 respectively.

Further, regarding the digital signal processing circuit 402, although a case has been described wherein a delay circuit is used, the present invention is not limited to this. Any circuit may equally be used as long as it carries out other signal processing with respect to the digital signal.

Moreover, as described in the first embodiment, any attenuating factor can be set by the analog/digital multiple string attenuator 5 through an attenuation and adjustment operation such as an attenuating operation.

With the above arrangement, when the mutually coupled switches 6 and 7 are respectively changed over to the contacts 6a and 7a, i.e., to the analog system signal processing section 3, the analog system signal is entered via the contact 6a and the analog input terminal AI1 into the analog attenuator 1 in the analog/digital multiple string attenuator 5.

As described previously in the first embodiment, the analog system signal is sent to an external device via the analog output terminal AO1, the contact 7a and the common terminal 7c after being attenuated at the attenuating factor of the analog attenuator 1.

On the other hand, when the mutually coupled switches 6 and 7 are changed over to the contacts 6b and 7b, i.e., to the digital system signal processing section 4, the analog system signal is entered into the A/D convertor 401 via the common terminal 6c, the contact 6b and the analog input terminal AI2. In the A/D convertor 401, the analog system signal is converted into a digital signal and sent to the digital signal processing circuit 402. Signal processing such as digital delay is then carried out by the digital signal processing circuit 402 with respect to the digital signal entered therein.

As described earlier in the first embodiment, the delayed digital signal is sent to the D/A convertor 403 after being attenuated by the digital attenuator 2 at an attenuating factor which is identical to the attenuating factor of the analog attenuator 1. The D/A convertor 403 converts the attenuated digital signal into an analog signal and releases the analog signal to the external device via the analog output terminal AO2, the contact 7b and the common terminal 7c.

As described above, with respect to the analog system signal of the same input level, an output level of the analog system signal processing section 3 and an output level of the digital system signal processing section 4 are always identical when the analog system signal processing section 3 is changed over to the digital system signal processing section 4 and vice versa. This is because the attenuating factor of the analog system signal processing section 3 and the attenuating factor of the digital system signal processing section 4 are always identical.

According to the configuration of the present invention, frequent analog processing in the digital attenuator 2 can be avoided. Consequently, compared to the conventional method whereby the resistance attenuator is installed after the D/A convertor in order to carry out attenuation, contamination of analog system noise can be avoided and high quality analog output can reliably be achieved.

Further, according to the configuration of the present invention, if the digital signal (an input signal of the D/A convertor 403) is directly transmitted to the external device such as an amplifier having a D/A convertor instead of being converted into the analog signal by the D/A convertor 403, deterioration of signal quality during transmission (such as lowering of level due to power loss occurring in a transmission path) is reduced. Moreover, the attenuating factor of the digital system signal can easily be made identical to the attenuating factor of the analog system signal by an attenuation adjusting operation (such as a simple attenuating operation) which is similar to the operation whereby the analog signal is adjusted by the resistance attenuator. This is possible because the attenuators have the same attenuating characteristics and have a mutually coupled operation.

As described above, a signal level attenuating device of the second embodiment in accordance with the present invention comprises a first analog signal level attenuating section having a first analog signal attenuating means for attenuating a level of an analog signal at any attenuating factor; and a second analog signal level attenuating section including first converting means for converting the analog signal into a digital signal, digital signal processing means for carrying out fixed signal processing with respect to the digital signal which is converted by the first converting means, a DC source which releases a reference voltage, second analog signal attenuating means for attenuating the reference voltage released from the DC source at any attenuating factor, second converting means for converting an output of the second analog signal attenuating means into a digital signal, attenuation coefficient generating means for computing an attenuation coefficient of a digital signal based on an output of the second converting means, multiplying means for attenuating a level of the digital signal by multiplying the attenuation coefficient with the digital signal, and third converting means for converting an output of the multiplying means into an analog signal, wherein the first analog signal attenuating means and the second analog signal attenuating means have the same attenuating characteristics and are mutually coupled, an analog signal level attenuating factor of the first analog signal level attenuating section being identical to an analog signal level attenuating factor in the second analog signal level attenuating section.

Accordingly, apart from the effects noted in the first embodiment, frequent analog processing in the second analog signal level attenuating section can be avoided. Consequently, contamination of analog system noise can be avoided and an analog signal having an improved signal quality can reliably be achieved.

Further, if the digital signal released from the multiplying means is directly transmitted to the external device having a D/A convertor section, not only can deterioration of signal quality during transmission be prevented, but also the attenuating factor of the digital signal can be easily adjusted by a simple attenuating factor adjusting operation. Operability of the device thereby improves remarkably.

The invention being thus described, it may be obvious that the same may be varied in many ways. Such variations are not to be regarded as a departure from the scope of the invention.

There are described above novel features which the skilled artisan will appreciate give rise to advantages.

These are each independent aspects of the invention to be covered by the present application, irrespective of whether or not they are included within the scope of the following claims.

What is claimed is:

1. A signal level attenuating device comprising:
   first attenuating means for attenuating an analog signal entered therein; and
   second attenuating means for attenuating a digital signal entered therein,
   wherein the first and second attenuating means have the same attenuating characteristics and are mutually coupled, and
   an attenuating factor of the first attenuating means and an attenuating factor of the second attenuating means are adjusted so as to be always identical.

2. The signal level attenuating device as set forth in claim 1, wherein the first attenuating means comprises a first resistance attenuator.

3. The signal level attenuating device as set forth in claim 2, wherein the second attenuating means comprises:
   reference voltage generating means for generating a reference voltage;
   a second resistance attenuator for attenuating the reference voltage, the second resistance attenuator having the same attenuating characteristics as the first resistance attenuator,
   A/D converting means for converting an output of the second resistance attenuator to a digital signal,
   attenuation coefficient generating means for computing an attenuation coefficient by which the digital signal entered therein is to be multiplied, based on an output of the A/D converting means, and
   multiplying means for multiplying the digital signal entered therein by the attenuation coefficient, thereby making the attenuating factor of the digital signal identical to the attenuating factor of the analog signal which is attenuated by the first resistance attenuator.

4. A signal level attenuating device comprising:
   first attenuating means for attenuating an analog signal entered therein;
   A/D converting means for converting an analog signal entered therein into a digital signal;
   signal processing means for carrying out delay processing with respect to an output of the A/D converting means; and
   second attenuating means for attenuating an output of the signal processing means,
   wherein the first and the second attenuating means have the same attenuating characteristics and are mutually coupled, and
   an attenuating factor of the first attenuating means and an attenuating factor of the second attenuating means are adjusted so as to be always identical.

5. The signal level attenuating device as set forth in claim 4, further comprising a D/A converting means for converting an output of the second attenuating means to an analog signal, wherein
   an output of the signal level attenuating device is released from the D/A converting means.

6. The signal level attenuating device as set forth in claim 5, further comprising:
   first changeover means for changing over the analog signal entered therein to the first attenuating means or to the A/D converting means; and second changeover means for changing over from an output of the first attenuating means to an output of the D/A converting means and vice versa and releasing one of the outputs as the output of the signal level attenuating device, wherein the first changeover means is coupled to the second changeover means, and the output of the signal level attenuating device is released from the first attenuating means when the analog signal is entered into the first attenuating means and the output of the signal level attenuating device is released from the D/A converting means when the analog signal is entered into the A/D converting means.

7. The signal level attenuating device as set forth in claim 4, wherein the first attenuating means comprises a first resistance attenuator.

8. The signal level attenuating device as set forth in claim 7, wherein the second attenuating means comprises:

reference voltage generating means for generating a reference voltage;

a second resistance attenuator for attenuating the reference voltage, the second resistance attenuator having the same attenuating characteristics as the first resistance attenuator;

A/D converting means for converting an output of the second resistance attenuator to a digital signal;

attenuation coefficient generating means for computing an attenuation coefficient by which the digital signal entered therein is to be multiplied, based on an output of the A/D converting means; and multiplying means for multiplying the digital signal entered therein by the attenuation coefficient, thereby making the attenuating factor of the digital signal identical to the attenuating factor of the analog signal attenuated by the first resistance attenuator.

9. A signal level attenuating device comprising:

a first analog signal level attenuating section having first analog signal attenuating means for attenuating a level of an analog signal at any attenuating factor; and a second analog signal level attenuating section, the second analog signal level attenuating section including:

first converting means for converting the analog signal into a digital signal;

digital signal processing means for carrying out a predetermined signal processing with respect to the digital signal which is converted by the first converting means;

a DC source for releasing a reference voltage;

second analog signal attenuating means for attenuating the reference voltage released from the DC source at any attenuating factor;

second converting means for converting an output of the second analog signal attenuating means into a digital signal;

attenuation coefficient generating means for computing an attenuation coefficient of the digital signal based on an output of the second converting means;

multiplying means for attenuating a level of the digital signal by multiplying the digital signal by the attenuation coefficient; and third converting means for converting an output of the multiplying means into an analog signal, wherein the first analog signal attenuating means and the second analog signal attenuating means have the same attenuating characteristics and are mutually coupled, an analog signal level attenuating factor in the first analog signal level attenuating section being identical to an analog signal level attenuating factor in the second analog signal level attenuating section.

* * * * *